(12) United States Patent
Son et al.

(10) Patent No.: US 12,256,527 B2
(45) Date of Patent: Mar. 18, 2025

(54) DISPLAY APPARATUS

(71) Applicant: LG Display Co., Ltd., Seoul (KR)

(72) Inventors: Sungsik Son, Gumi-si (KR); Wontae Kim, Chilgok-gun (KR)

(73) Assignee: LG DISPLAY CO., LTD., Seoul (KR)

( * ) Notice: Subject to any disclaimer, the term of this patent is extended or adjusted under 35 U.S.C. 154(b) by 181 days.

(21) Appl. No.: 17/966,511

(22) Filed: Oct. 14, 2022

(65) Prior Publication Data
US 2023/0156984 A1 May 18, 2023

(30) Foreign Application Priority Data

Nov. 15, 2021 (KR) .......................... 10-2021-0156314

(51) Int. Cl.
*H05K 9/00* (2006.01)
*B60K 35/00* (2006.01)
*B60K 35/22* (2024.01)

(52) U.S. Cl.
CPC .......... *H05K 9/0054* (2013.01); *B60K 35/00* (2013.01); *B60K 35/22* (2024.01)

(58) Field of Classification Search
CPC .......... H05K 9/0054; H05K 7/00; H05K 7/02; B60K 35/00; B60K 35/22; B60K 2360/1523; B60K 2360/652; B60K 2360/816; B60K 35/50; G09F 9/301; G09F 9/335; G09F 9/35; G02F 1/1333; G02F 1/133308; G02F 1/133305; G02F 1/13338
See application file for complete search history.

(56) References Cited

U.S. PATENT DOCUMENTS

| | | | |
|---|---|---|---|
| 9,177,904 B2 * | 11/2015 | Jung | .................... H10K 59/179 |
| 9,622,391 B2 * | 4/2017 | Lee | .................... G02F 1/13452 |
| 9,798,414 B2 | 10/2017 | Kim et al. | |
| 9,806,284 B2 * | 10/2017 | Goto | .................. H10K 59/8722 |
| 9,818,974 B2 | 11/2017 | Kwon et al. | |
| 10,520,762 B2 | 12/2019 | Jung et al. | |
| 10,811,471 B2 | 10/2020 | Jeon et al. | |
| 11,036,263 B2 | 6/2021 | Lee | |
| 11,668,983 B2 | 6/2023 | Lim et al. | |

(Continued)

FOREIGN PATENT DOCUMENTS

| | | | |
|---|---|---|---|
| CN | 105938405 A | 9/2016 | |
| CN | 106887186 A | 6/2017 | |

(Continued)

*Primary Examiner* — Rockshana D Chowdhury
(74) *Attorney, Agent, or Firm* — Birch, Stewart, Kolasch & Birch, LLP (57) ABSTRACT

A display apparatus can include a display panel configured to display or reproduce an image or a video, a guide panel disposed in rear of the display panel, a printed circuit board mounted on the guide panel and electrically connected to the display panel, and a chip on film (COF). The COF can have one side electrically connected to the display panel and another side electrically connected to the printed circuit board. A portion of the COF can be bent to surround the guide panel. Further, in the guide panel, a buffer for alleviating an impact applied to the COF can be formed in a portion surrounded by the COF. In addition, a plurality of buffer bars can be disposed to be spaced apart from each other in a vertical direction of the guide panel.

11 Claims, 9 Drawing Sheets

(56) References Cited

U.S. PATENT DOCUMENTS

| | | | |
|---|---|---|---|
| 2014/0078692 A1* | 3/2014 | Park | H05K 3/361 361/749 |
| 2014/0217382 A1* | 8/2014 | Kwon | H10K 50/8426 257/40 |
| 2016/0147361 A1* | 5/2016 | Ahn | G06F 3/041 345/173 |
| 2016/0204183 A1* | 7/2016 | Tao | H10K 59/131 438/34 |
| 2016/0259469 A1 | 9/2016 | Kim et al. | |
| 2016/0293869 A1* | 10/2016 | Saeki | H10K 59/131 |
| 2018/0053790 A1* | 2/2018 | Kwon | H01L 27/1218 |
| 2018/0102072 A1* | 4/2018 | Lee | G06F 1/1652 |
| 2018/0196300 A1 | 7/2018 | Jung et al. | |
| 2018/0286293 A1* | 10/2018 | Liu | H05K 1/028 |
| 2018/0306968 A1* | 10/2018 | Matsubara | G02B 6/0088 |
| 2019/0206898 A1* | 7/2019 | Baek | H01L 27/1218 |
| 2019/0306967 A1* | 10/2019 | Yabuuchi | H05K 1/189 |
| 2020/0015356 A1* | 1/2020 | Park | H05K 1/189 |
| 2020/0150481 A1* | 5/2020 | You | H10K 77/111 |
| 2020/0192433 A1* | 6/2020 | Shin | H10K 59/131 |
| 2021/0288282 A1* | 9/2021 | Kim | G06F 1/1658 |
| 2022/0102387 A1* | 3/2022 | Ke | H01L 27/1218 |
| 2023/0189441 A1* | 6/2023 | Park | G02F 1/13452 361/807 |

FOREIGN PATENT DOCUMENTS

| | | |
|---|---|---|
| CN | 108305564 A | 7/2018 |
| CN | 110176475 A | 8/2019 |
| CN | 111694176 A | 9/2020 |
| CN | 111785165 A | 10/2020 |
| CN | 112820208 A | 5/2021 |
| KR | 10-2019-0076222 A | 7/2019 |
| KR | 10-2020-0128258 A | 11/2020 |
| KR | 10-2020-0129646 A | 11/2020 |

* cited by examiner

DISPLAY APPARATUS

CROSS-REFERENCE TO RELATED APPLICATION

This application claims priority to and benefit of Korean Patent Application No. 10-2021-0156314 filed on Nov. 15, 2021 in the Republic of Korea, the entire contents of which are hereby expressly incorporated by reference into the present application.

BACKGROUND OF THE DISCLOSURE

Technical Field

The present disclosure relates to a display apparatus, and more particularly, to a display apparatus having a structure to effectively cope with an external impact.

Description of Related Art

As the world enters a full-fledged information era, a display apparatus that visually expresses an electrical information signal has developed rapidly. In response thereto, various display apparatuses having excellent performance, thinness, light weight, and low power consumption have been developed.

Such display apparatuses include a liquid crystal display apparatus (LCD), a quantum dot (QD) display apparatus, a field emission display apparatus (FED), an electro-wetting display apparatus (EWD), an organic light-emitting display apparatus (OLED), etc.

The display apparatus can be miniaturized so that the apparatus can be carried by a user. Further the display apparatus has been developed to be mounted on a movable apparatus such as a vehicle. Thus, the user can use the display apparatus on the vehicle more conveniently.

SUMMARY OF THE DISCLOSURE

When a display apparatus is mounted on a movable apparatus such as a vehicle, an impact that can be received from the outside by a movement can be transmitted to the display apparatus.

Due to the external impact, the display apparatus can be deformed or, in severe cases, can be damaged due to the external impact. When the damage is severe, fragments of the display apparatus can injure the user on board the vehicle.

Even when such display apparatus is not damaged, when the display apparatus receives the external impact, a malfunction, a failure, and the like of the display apparatus can occur due to the external impact.

In particular, in a case of a display apparatus having a slim structure or a display apparatus having a display having a flexible structure that is bent, the effect of the external impact can be greater.

The display apparatus can have a chip on film (COF). A driving apparatus for driving the display apparatus can be embedded in the chip on film. The chip on film can be made of a thin flexible material. Therefore, the chip on film is efficient to increase convenience of assembly and to reduce a space occupied by parts.

The chip on film can be vulnerable to an external impact because it is formed to be thin. Due to such external impact, the chip on film can be damaged. Therefore, a development of a technology that can suppress or minimize the damage of the chip on film resulted from the external impact is desired.

Therefore, a purpose of the present disclosure is to provide a display apparatus having a structure that can effectively cope with such external impact.

Further, a purpose of the present disclosure is to provide a display apparatus having a structure that can suppress or minimize the chip on film from being damaged due to the external impact.

Further, a purpose of the present disclosure is to provide a display apparatus having a buffer capable of suppressing or minimizing the impact applied directly to the chip on film by mitigating the external impact applied to the chip on film.

Another purpose of the present disclosure is to provide a display apparatus which can address the above-identified and other limitations and disadvantages associated with the related art.

Purposes of the present disclosure are not limited to the above-mentioned purpose. Other purposes and advantages of the present disclosure that are not mentioned can be understood based on following descriptions, and can be more clearly understood based on embodiments of the present disclosure. Further, it will be easily understood that the purposes and advantages of the present disclosure can be realized using means shown in the claims and combinations thereof.

According to one or more embodiments of the present disclosure, a display apparatus can include a display panel, a guide panel, a printed circuit board, and a chip on film (COF).

According to one or more embodiments of the present disclosure, an image or a video can be reproduced on the display panel. The guide panel can be disposed in the rear of (or back of or behind) the display panel. The printed circuit board can be mounted on the guide panel and electrically connected to the display panel.

According to one or more embodiments of the present disclosure, one side of the chip on film can be electrically connected to the display panel, and another side thereof can be electrically connected to the printed circuit board. The chip on film can be disposed such that a portion thereof is bent to surround the guide panel.

According to one or more embodiments of the present disclosure, the display apparatus can further include a cover glass, a first adhesive layer, a touch sensor, a second adhesive layer, a back plate, and a metal plate.

According to one or more embodiments of the present disclosure, the cover glass can be disposed in front of the display panel to protect the display panel. The touch sensor can be disposed in the rear of the cover glass and disposed in front of the display panel, and can recognize a touch input of a user.

According to one or more embodiments of the present disclosure, the first adhesive layer can be disposed between the cover glass and the touch sensor. The first adhesive layer can adhere the touch sensor to the cover glass as one face thereof is adhered to the cover glass and the other face thereof is adhered to the touch sensor.

According to one or more embodiments of the present disclosure, the second adhesive layer can be disposed between the touch sensor and the display panel. The second adhesive layer can adhere the touch sensor to the display panel as one face thereof is adhered to the touch sensor and the other face thereof is adhered to the display panel.

According to one or more embodiments of the present disclosure, the back plate can be disposed in the rear of the display panel. The back plate can be attached to a rear face of the display panel to suppress the display panel from being bent and damaged.

According to one or more embodiments of the present disclosure, the metal plate can be disposed in the rear of the back plate and disposed in front of the guide panel. The metal plate can be placed in contact with a rear face of the back plate, and can serve as a heat sink for cooling the display panel by dissipating heat generated from the display panel to the outside.

According to one or more embodiments of the present disclosure, the chip on film can be disposed such that a portion thereof is bent to surround a lower end of the guide panel. In this regard, in the guide panel, a buffer for alleviating an impact applied to the chip on film is formed in a portion of the lower end of the guide panel surrounded by the chip on film.

According to one or more embodiments of the present disclosure, the chip on film can include a plurality of chip on films, and the plurality of chip on films can be disposed at positions spaced apart from each other at a bottom of the guide panel. The buffer can include a plurality of buffers disposed at an end of the guide panel in a number corresponding to the number of the chip on films.

According to one or more embodiments of the present disclosure, the buffers can be disposed at positions spaced apart from each other at the bottom of the guide panel, and each buffer can be disposed at a position corresponding to each chip on film.

According to one or more embodiments of the present disclosure, the buffer can include a buffer space and a buffer bar. The buffer space can be defined at an end of the guide panel. The buffer bar can include a plurality of buffer bars disposed to be spaced apart from each other in the buffer space, and the buffer bar can be elastically deformable when subjected to the impact.

Further, in the display apparatus according to one or more embodiments of the present disclosure, the plurality of buffer bars are disposed so as to be spaced apart from each other in the vertical direction of the guide panel, so that, when the guide panel moves in the vertical direction by the external impact and collides with the chip on film, the buffer bars can be elastically deformed to suppress the impact applied to the chip on film. Accordingly, even when the guide panel moves by the external impact and collides with the chip on film, as the impact applied to the chip on film is alleviated by the buffer bar, a damage of the chip on film can be effectively suppressed.

Further, in the display apparatus according to one or more embodiments of the present disclosure, the node can be formed such that the cross-sectional area thereof decreases toward a central portion. Because of such structure, the damage to the buffer bar at the abrupt step can be effectively suppressed by preventing the formation of the abrupt step at the boundary between the node and the body.

Further, in the display apparatus according to one or more embodiments of the present disclosure, an impact force occurred on the chip on film as the guide panel collides with the chip on film is alleviated by the deformation and the movement of the buffer bar. Accordingly, the damage to the chip on film by the external impact can be significantly suppressed.

Further, in the display apparatus according to one or more embodiments of the present disclosure, the driving chip is disposed on the linear portion far from the lower end of the guide panel without being disposed on the bent portion, so that, even when the guide panel and the chip on film come into contact with each other due to the external impact, the contact between the guide panel and the driving chip is avoided, thereby effectively suppressing the damage to the driving chip.

Effects of the present disclosure are not limited to the above-mentioned effects, and other effects as not mentioned will be clearly understood by those skilled in the art from following descriptions.

The purposes, solutions, and effects of the disclosure as described above does not specify essential features of claims. Thus, the scope of claims is not limited by the purposes, solutions, and effects of the disclosure as described above.

BRIEF DESCRIPTION OF DRAWINGS

The present disclosure will become more fully understood from the detailed description given hereinbelow and the accompanying drawings which are given by way of illustration only, and thus are not limitative of the present disclosure.

DETAILED DESCRIPTIONS OF THE EMBODIMENTS

Advantages and features of the present disclosure, and how to achieve them will become apparent with reference to the embodiments described below in detail in conjunction with the accompanying drawings. However, the present disclosure is not limited to the embodiments as disclosed below, but will be implemented in a variety of different forms. Only these embodiments make the present disclosure complete, and are constructed to fully inform those having common knowledge in the technical field to which the present disclosure belongs of a scope of the disclosure. The scope of the present disclosure is only defined by the scope of the claims.

A shape, a size, a ratio, an angle, a number, etc. disclosed in the drawings for illustrating embodiments of the present disclosure are exemplary, and the present disclosure is not limited thereto. The same reference numerals refer to the same elements herein. Further, in describing the present disclosure, when it is determined that a detailed description of a related known element can unnecessarily obscure gist of the present disclosure, the detailed description thereof will be omitted. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof.

In interpreting a numerical value, the value is interpreted as including an error range unless there is no separate explicit description thereof.

It will be understood that when an element or layer is referred to as being "connected to", or "coupled to" another element or layer, it can be directly on, connected to, or coupled to the other element or layer, or one or more intervening elements or layers can be present. In addition, it will also be understood that when an element or layer is referred to as being "between" two elements or layers, it can be the only element or layer between the two elements or layers, or one or more intervening elements or layers can also be present. In addition, it will also be understood that when a first element or layer is referred to as being present "on" or "beneath" a second element or layer, the first element can be disposed directly on or beneath the second element or can be disposed indirectly on or beneath the second element with a third element or layer being disposed between the first and second elements or layers.

Further, as used herein, when a layer, film, region, plate, or the like is disposed "on" or "on a top" of another layer, film, region, plate, or the like, the former can directly contact the latter or still another layer, film, region, plate, or the like can be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former can directly contact the latter or still another layer, film, region, plate, or the like can be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event can occur therebetween unless "directly after", "directly subsequent" or "directly before" is not indicated.

It will be understood that, although the terms "first", "second", "third", and so on can be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various embodiments of the present disclosure can be partially or entirely combined with each other, and can be technically associated with each other or operate with each other. The embodiments can be implemented independently of each other and can be implemented together in an association relationship.

In descriptions of temporal relationships, for example, temporal precedent relationships between two events such as "after", "subsequent to", "before", etc., another event can occur therebetween unless "directly after", "directly subsequent" or "directly before" is not indicated. The features of the various embodiments of the present disclosure can be partially or entirely combined with each other, and can be technically associated with each other or operate with each other. The embodiments can be implemented independently of each other and can be implemented together in an association relationship. Spatially relative terms, such as "beneath," "below," "lower," "under," "above," "upper," and the like, can be used herein for ease of explanation to describe one element or feature's relationship to another element or feature as illustrated in the figures. It will be understood that the spatially relative terms are intended to encompass different orientations of the apparatus in use or in operation, in addition to the orientation depicted in the figures. For example, when the apparatus in the drawings can be turned over, elements described as "below" or "beneath" or "under" other elements or features would then be oriented "above" the other elements or features. Thus, the example terms "below" and "under" can encompass both an orientation of above and below. The apparatus can be otherwise oriented for example, rotated 90 degrees or at other orientations, and the spatially relative descriptors used herein should be interpreted accordingly.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. Further, all the components of each display apparatus according to all embodiments of the present disclosure are operatively coupled and configured.

Figure 1:
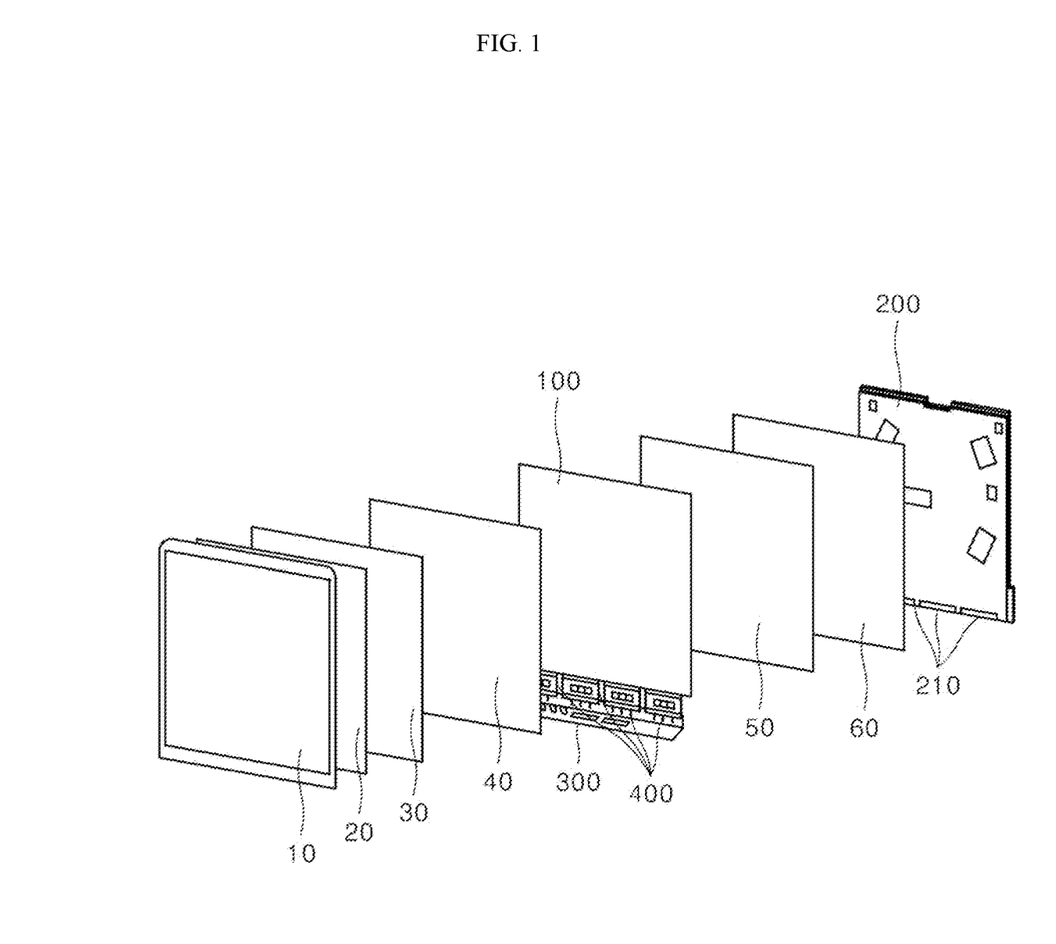
FIG. 1 is an exploded perspective view showing a display apparatus according to an embodiment of the present disclosure.
Figure 2:
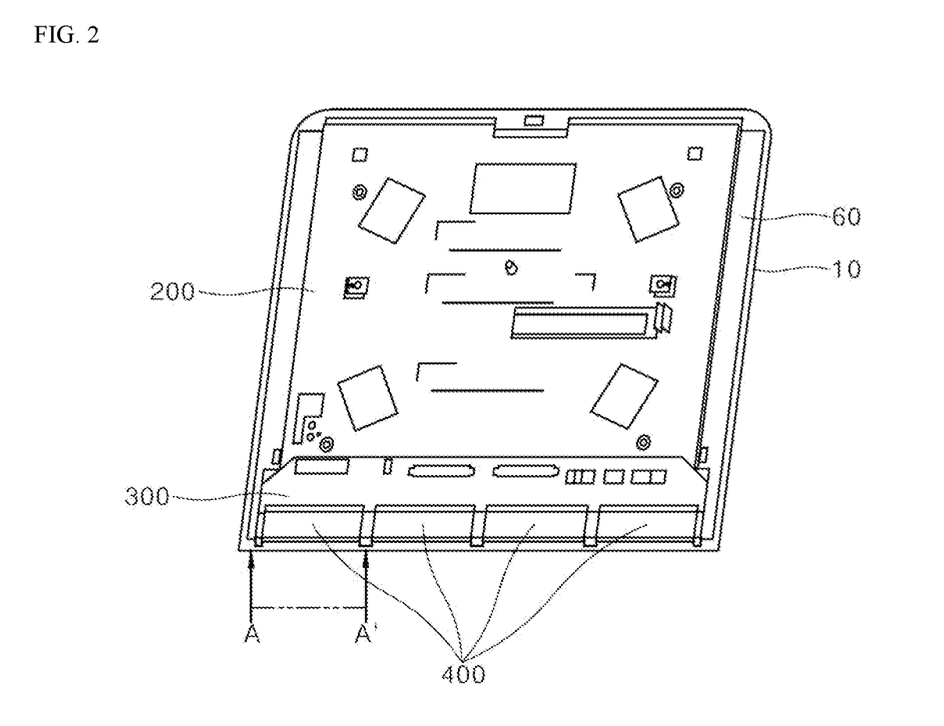
FIG. 2 is a rear face perspective view showing a display apparatus according to an embodiment of the present disclosure.

FIG. 1 is an exploded perspective view showing a display apparatus according to an embodiment of the present disclosure. FIG. 2 is a rear face perspective view showing a display apparatus according to an embodiment of the present disclosure.

A display apparatus according to an embodiment can be mounted on a cockpit of a vehicle, for example, to provide an image or a video necessary for driving to a driver and a passenger of the vehicle. However, the present disclosure may not be limited thereto, and the display apparatus can be used while being carried by a user without being mounted in the vehicle. Hereinafter, for example, the display apparatus mounted in the vehicle will be described.

Referring to FIGS. 1 and 2, the display apparatus according to an embodiment can include a display panel 100, a guide panel 200, a printed circuit board 300, and a chip on film (COF) 400.

The image or the video can be displayed or reproduced on the display panel 100. The reproduced image or video can be navigation information necessary for the driving, an image filmed by a camera mounted on the vehicle, or other various contents necessary for the driver or the passenger.

The guide panel 200 can be disposed in the rear of the display panel 100. The guide panel 200 can be disposed at the rearmost portion of the display apparatus. Various parts of the display apparatus including the display panel 100 can be mounted on the guide panel 200. Further, the guide panel 200 itself can be mounted on the cockpit of the vehicle. To this end, the guide panel 200 can have a necessary coupling structure such as a screw hole and the like.

The printed circuit board 300 can be mounted on the guide panel 200 and can be electrically connected to the display panel 100. The printed circuit board 300 can include an apparatus for communication with an external apparatus such as the camera and a main control module of the vehicle, an apparatus for driving the display panel 100 such that the display panel 100 reproduces the image or the video, and the like, can include a circuit, and can include various other active and passive elements.

One side of the chip on film 400 can be electrically connected to the display panel 100 and the other side (or another side) of the chip on film 400 can be electrically connected to the printed circuit board 300. The chip on film 400 can be partially bent to surround the guide panel 200. However, in FIG. 1, a development view of the chip on film 400 in an unfolded state is shown for a clear description.

The chip on film 400 can be formed in a thin form and can be made of a flexible material so as to be bendable. The chip on film 400 can electrically connect the display panel 100 and the printed circuit board 300 to each other. The chip on film 400 can be provided with various active elements and passive elements and can be provided with a driving circuit for driving the display panel 100.

The driving circuit for driving the display panel 100 can be distributed on the printed circuit board 300 and the chip on film 400. The chip on film 400 can include a driving chip 401 that forms at least a portion of the driving circuit of the display panel 100. The chip on film 400 can include a plurality of chip on films. The chip on films 400 can be disposed to be spaced apart from each other.

The display apparatus according to an embodiment can further include a cover glass 10, a first adhesive layer 20, a touch sensor 30, a second adhesive layer 40, a back plate 50, and a metal plate 60. Such parts can be formed in a thin form to manufacture a display panel of a slim form.

The cover glass 10 can be disposed in front of the display panel 100 to protect the display panel 100. The cover glass 10 can be made of a transparent material, so that light irradiated from the cover glass 10 can pass through the cover glass 10.

The touch sensor 30 can be disposed in the rear of the cover glass 10 and disposed in front of the display panel 100, and can recognize a touch input of a user. The touch sensor 30 can recognize, for example, the input of the user in a capacitive manner.

When the user inputs information using a hand, a pen, or the like on the cover glass 10, the touch sensor 30 can recognize the input of the user and the user can manipulate the display apparatus through the same.

The first adhesive layer 20 can be disposed between the cover glass 10 and the touch sensor 30. The first adhesive layer 20 can adhere the touch sensor 30 to the cover glass 10 as one face thereof is adhered to the cover glass 10 and the other face thereof is adhered to the touch sensor 30.

The second adhesive layer 40 can be disposed between the touch sensor 30 and the display panel 100. The second adhesive layer 40 can adhere the touch sensor 30 to the display panel as one face thereof is adhered to the touch sensor 30 and the other face thereof is adhered to the display panel 100.

The first adhesive layer 20 and the second adhesive layer 40 can be made of a transparent material having good adhesion, for example, an optically clear adhesive (OCA). However, the present disclosure is not limited thereto.

The back plate 50 can be disposed in the rear of the display panel 100. The back plate 50 can be attached to a rear face of the display panel 100 to suppress the display panel 100 from being bent and damaged. For example, the back plate 50 can serve to reinforce rigidity of the display panel 100.

The back plate 50 can be formed in a shape of a film, for example, and can be attached to the display panel 100. However, the present disclosure is not limited thereto.

The metal plate 60 can be disposed in the rear of the back plate 50 and disposed in front of the guide panel 200. The metal plate 60 can be disposed to be in contact with a rear face of the back plate 50, and can serve as a heat sink for cooling the display panel 100 by dissipating heat generated from the display panel 100 to the outside.

The metal plate 60 can be easily manufactured via sheet metal processing or the like, and can be made of a material having a high heat transfer rate and excellent resistance, for example, an aluminum material. However, the present disclosure is not limited thereto.

Figure 3:
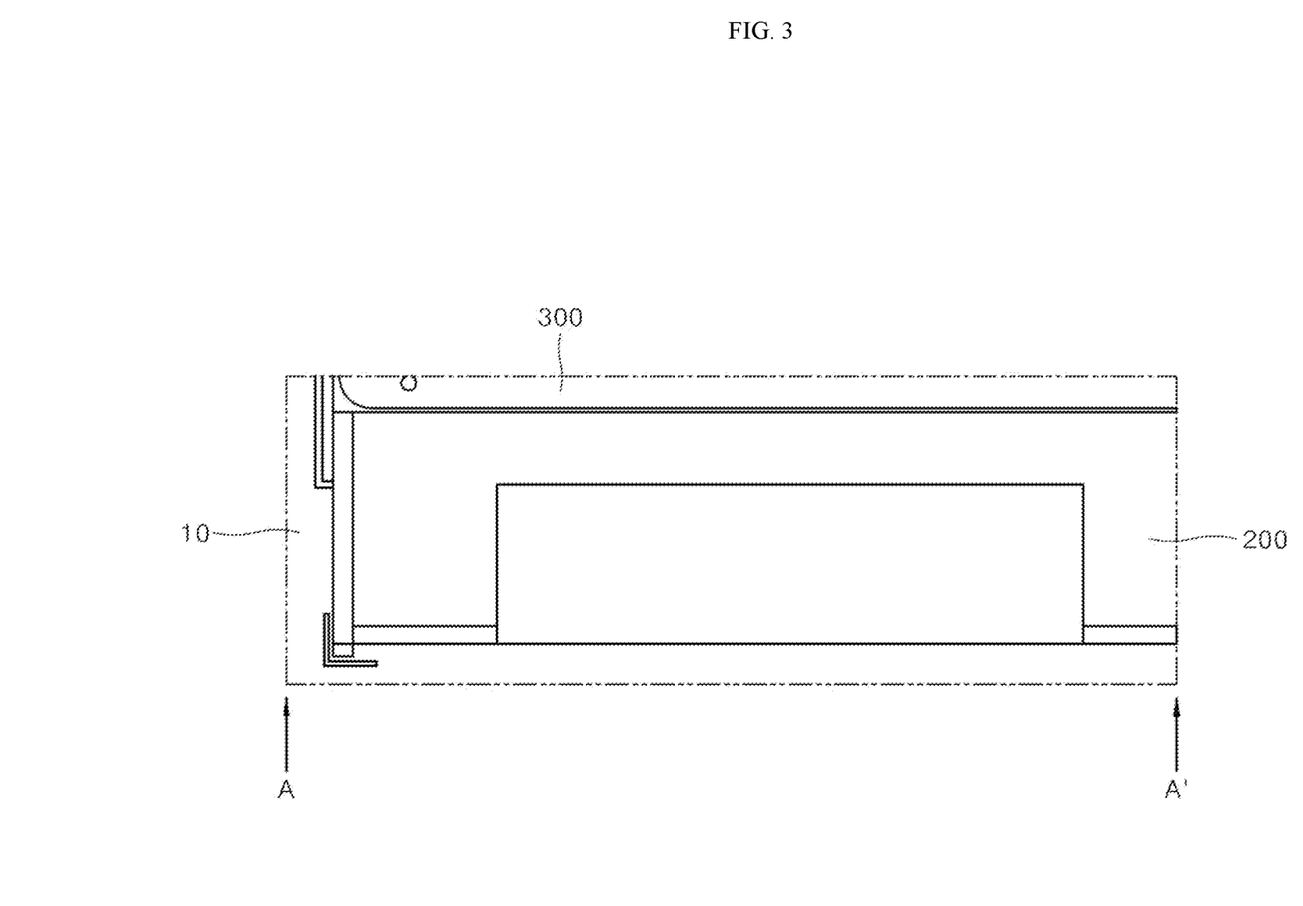
FIG. 3 is a view showing a comparative example for comparison with a display apparatus of the present disclosure.

FIG. 3 is a view showing a comparative example for comparison with a display apparatus of the present disclosure. FIG. 3 shows a cross-section of a portion of the comparative example that is a contrast to a portion taken along a line AA' in FIG. 2 showing the display apparatus of the present disclosure.

Figure 4:
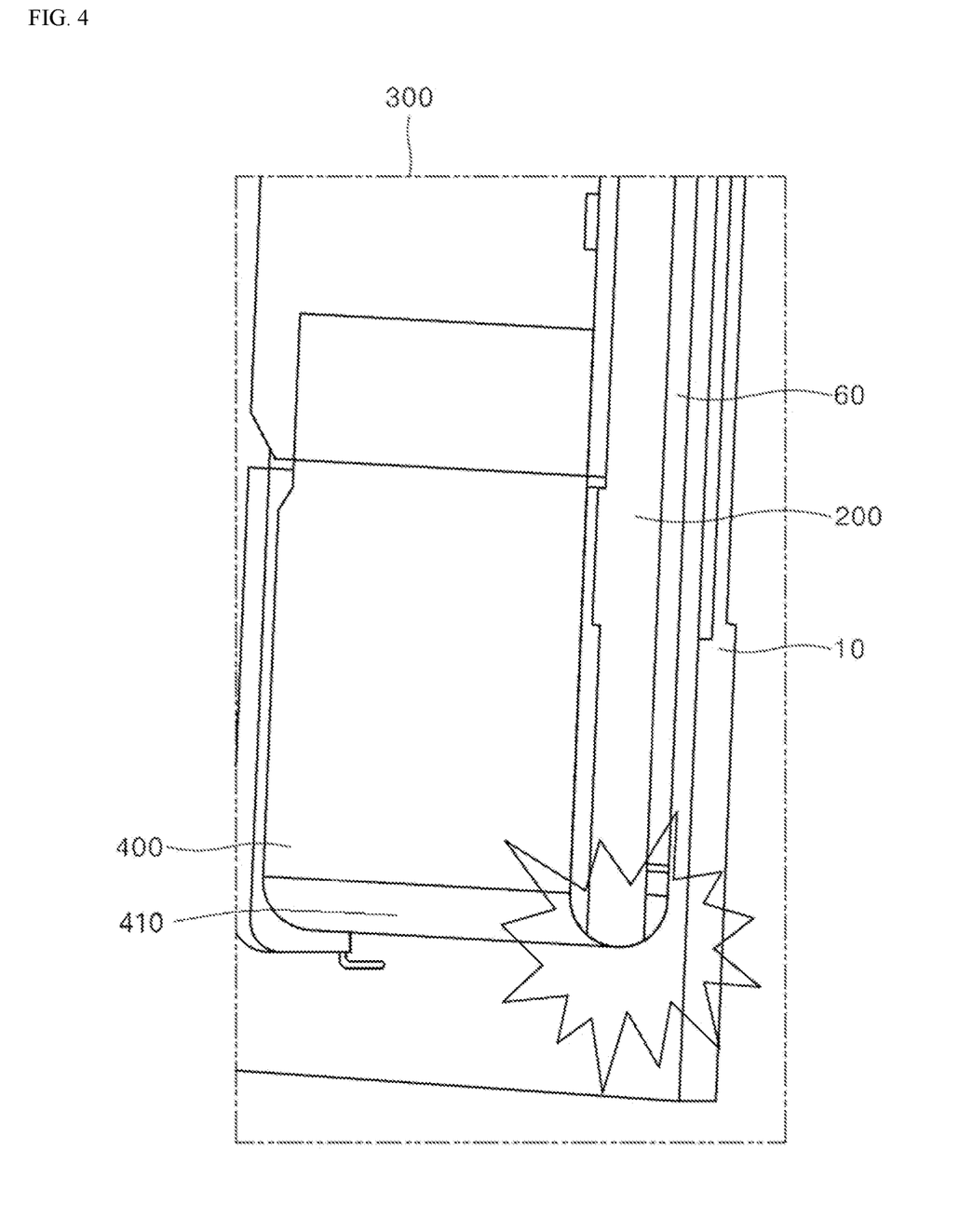
FIG. 4 is a partial cross-sectional view showing a comparative example for comparison with a display apparatus of the present disclosure.

For clear description, FIG. 3 has omitted the illustration of the chip on film 400. FIG. 4 is a partial cross-sectional view showing a comparative example for comparison with a display apparatus of the present disclosure.

The printed circuit board 300 can be mounted on a rear face of the guide panel 200. The display panel 100 can be disposed in front of the guide panel 200. Therefore, in order for the chip on film 400 to be electrically connected to the printed circuit board 300 and the guide panel 200, both ends of the chip on film 400 must be coupled to the printed circuit board 300 and the guide panel 200, respectively.

Therefore, the chip on film 400 should extend beyond the back plate 50 and the metal plate 60 between the guide panel 200 and the display panel 100, and further, should extend beyond the guide panel 200.

Because of such structure, when the display apparatus is assembled, as shown in FIG. 4, the chip on film 400 can be disposed to extend beyond the back plate 50, the metal plate 60, and the guide panel 200 along a lower end of the guide panel 200.

Looking at lower ends of the back plate 50, the metal plate 60, and the guide panel 200, the lower end of the guide panel 200 can be placed at the lowest position. This is because a length in a downward direction of the back plate 50 is greater than those of the metal plate 60 and the guide panel 200.

Accordingly, in the chip on film 400, a portion extending beyond the back plate 50, the metal plate 60, and the guide panel 200 can be bent at a portion corresponding to the lower end of the guide panel 200. Further, because of such structure, the chip on film 400 can be disposed to protrude from a lower end of the display panel 100.

A length of the chip on film 400 protruding from the lower end of the display panel 100, for example, a protrusion length is a length from the lower end of the display panel 100 to a lower end of the portion where the chip on film 400 is bent.

The protrusion length of the chip on film 400 is a length of a portion exposed from the lower end of the display panel 100. Accordingly, when the user views a front face of the display panel 100, the portion corresponding to the protrusion length comes into sight of the user, which can deteriorate aesthetics of the display apparatus.

Therefore, in order to increase the aesthetics of the display apparatus, the portion corresponding to the protrusion length of the chip on film 400 is invisible using black ink or the like on the cover glass 10, which becomes a bezel.

Further, as an area of the bezel increases, the aesthetics of the display apparatus can be reduced accordingly, and an unnecessary area of the display apparatus can be increased. Therefore, it is necessary to reduce the protrusion length of the chip on film 400 as much as possible in order to reduce the area of the bezel.

In order to reduce the protrusion length of the chip on film 400, the chip on film 400 can be disposed very close to the lower end of the guide panel 200 and be bent so as to extend beyond the guide panel 200. For this reason, a bent portion 410 of the chip on film 400 can be disposed at a position extremely adjacent to the lower end of the guide panel 200 in a vertical direction.

Because the bent portion 410 of the chip on film 400 is disposed at the position extremely adjacent to the lower end of the guide panel 200, the chip on film 400 can be vulnerable to an external impact.

The description will be made with reference to FIGS. 3 and 4 again. A buffer 210 to be described below is not formed at the lower end of the guide panel 200 in the comparative example. Therefore, in the comparative example, a portion corresponding to the chip on film 400 at the lower end of the guide panel 200 can be formed in a shape of a filled plate without a special structure as shown in FIG. 3.

In this regard, referring to FIG. 4, the bent portion 410 of the chip on film 400 can be disposed extremely adjacent to the lower end of the guide panel 200.

In such structure, when the external impact is applied to the display apparatus during the operation of the vehicle, the guide panel 200 can move by the external impact. When the guide panel 200 moves in the downward direction, the chip on film 400 disposed extremely adjacent to the lower end of the guide panel 200 can collide with the lower end of the guide panel 200.

When the lower end of the guide panel 200 collides with the chip on film 400 continuously and repeatedly, the chip on film 400 can be damaged or deformed, and thus, the circuits and the various elements disposed on the chip on film 400 can be damaged.

Such damage and deformation of the chip on film 400 can cause malfunction or operation stop of the display apparatus. Therefore, there is a need for a structure that can prevent the guide panel 200 from being damaged by colliding with the chip on film 400. Hereinafter, a structure of a display apparatus according to an embodiment having such a structure will be described in detail with reference to the drawings.

Figure 5:
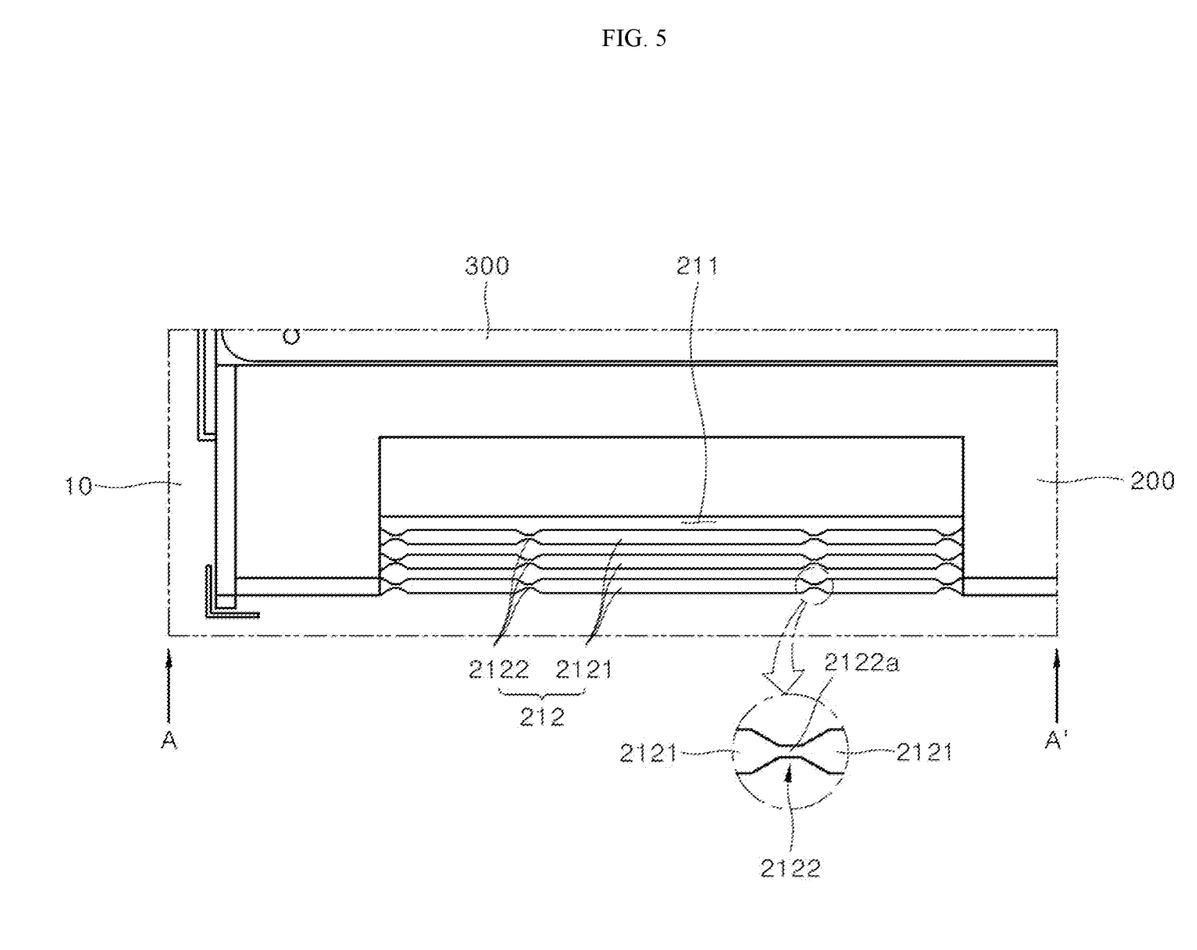
FIG. 5 is a partial view showing a display apparatus according to an embodiment of the present disclosure.
Figure 6:
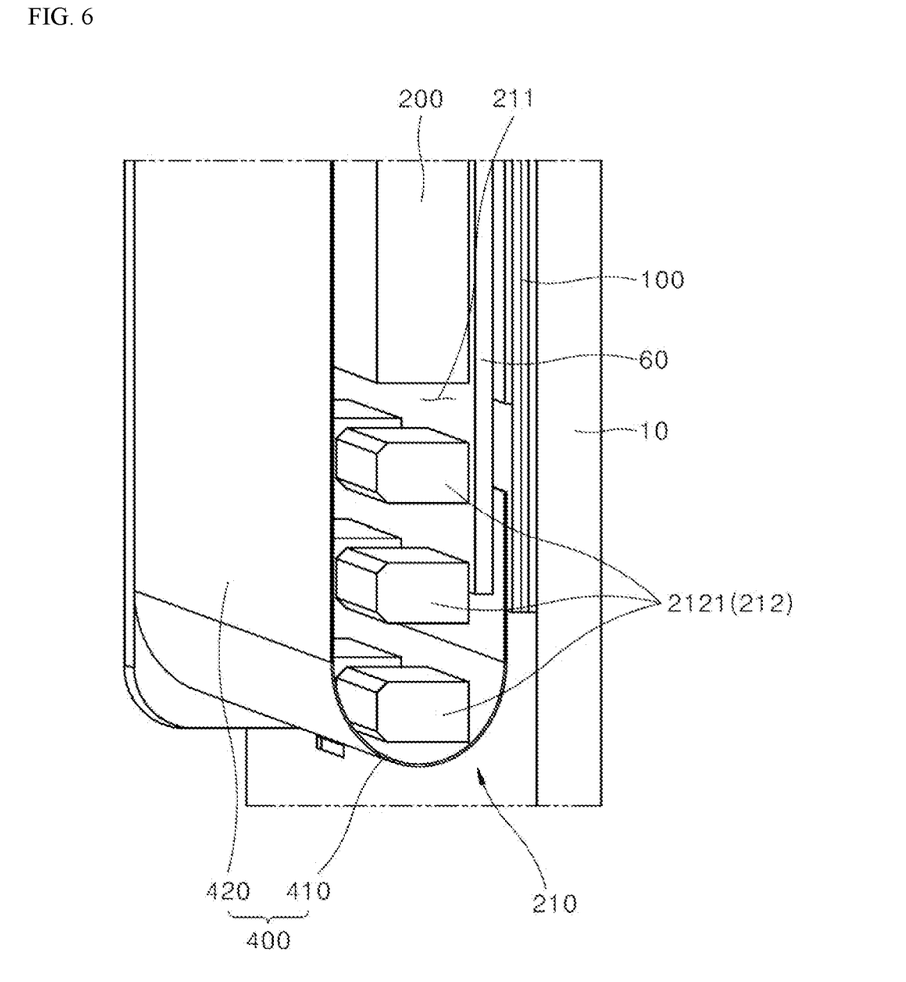
FIG. 6 is a partial cross-sectional view showing a cross-section of a body of a buffer bar in a display apparatus according to an embodiment of the present disclosure.
Figure 7:
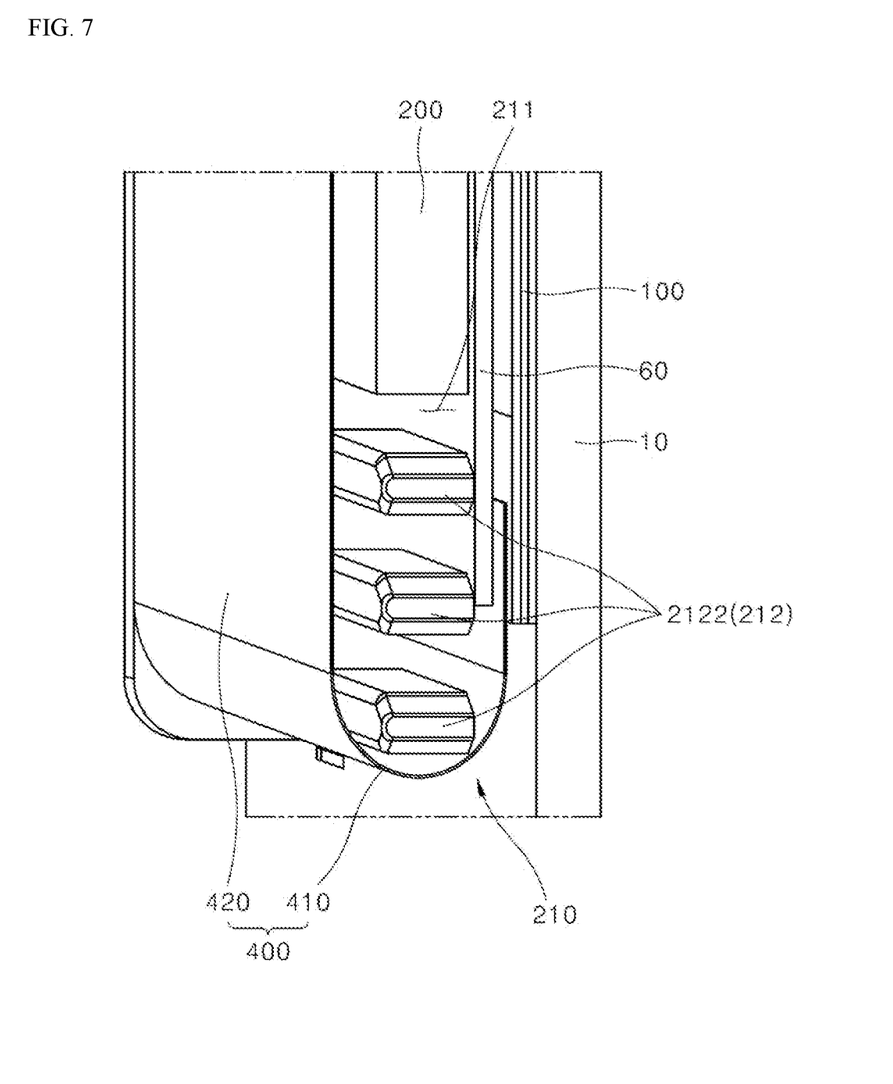
FIG. 7 is a partial cross-sectional view showing a cross-section of a node of a buffer bar in a display apparatus according to an embodiment of the present disclosure.

FIG. 5 is a partial view showing a display apparatus according to an embodiment of the present disclosure. FIG. 5 is a view taken along the line AA' in FIG. 2. FIG. 6 is a partial cross-sectional view showing a cross-section of a body 2121 of a buffer bar 212 in a display apparatus according to an embodiment. FIG. 7 is a partial cross-sectional view showing a cross-section of a node 2122 of the buffer bar 212 in the display apparatus according to an embodiment.

Referring to FIGS. 5-7, the chip on film 400 can be disposed such that the portion thereof is bent to surround the lower end of the guide panel 200. In this regard, in the guide panel 200, the buffer 210 for alleviating the impact applied to the chip on film 400 can be formed in a portion surrounded by the chip on film 400.

In this regard, the buffer 210 can be disposed in the portion where the chip on film 400 is bent. Accordingly, the bent portion 410 of the chip on film 400 can be disposed adjacent to a lower end of the buffer 210 disposed in the guide panel 200.

The chip on film 400 can include the plurality of chip on films, and the plurality of chip on films 400 can be disposed at positions spaced apart from each other at the bottom of the guide panel 200. The buffer 210 can be disposed at the end of the guide panel 200, and the number of buffers 210 can correspond to the number of the chip on films 400.

The buffers 210 can be disposed at positions spaced apart from each other at the bottom of the guide panel 200. Further, each buffer 210 can be disposed at a position corresponding to each of chip on film 400.

The chip on film 400 can include a bent portion 410 and a linear portion 420. The bent portion 410 can be disposed at the end of the guide panel 200 and can be formed in a bent shape to surround a portion of the buffer bar 212.

The bent portion 410 can be disposed below the buffer bar 212. In particular, a lower end of the bent portion 410 can be disposed to be extremely adjacent to a lower end of the buffer bar 212 in order to reduce the area of the bezel.

The linear portion 420 can be connected to the bent portion 410. The linear portion 420 can be disposed at the bottom of the guide panel 200 in a non-bent form. The linear portion 420 can be disposed to overlap front and rear faces of the guide panel 200 at the bottom of the guide panel 200.

The buffer 210 can include a buffer space 211 and the buffer bar 212. The buffer space 211 can be defined at the end of the guide panel 200. Compared with the above-described comparative example, the buffer space portion 211 can be defined by removing a lower portion of the guide panel 200. The buffer space 211 can provide a space in which the buffer bar 212 is able to move when subjected to the external impact.

The buffer bar 212 can include a plurality of buffer bars, and the plurality of buffer bars 212 can be disposed to be spaced apart from each other in the buffer space 211 and can be elastically deformable when subjected to the impact.

The buffer bars 212 can be formed in a shape of a bar and can be disposed such that a longitudinal direction thereof intersects the vertical direction of the guide panel 200. In this regard, for example, the buffer bar 212 can be integrally formed with the guide panel 200 via injection molding or the like.

The buffer bar 212 can include the plurality of buffer bars, and the plurality of buffer bars 212 can be disposed to be spaced apart from each other in the vertical direction of the guide panel 200. In this regard, a space in which the plurality of buffer bars 212 are spaced apart from each other can define the buffer space 211.

The plurality of buffer bars 212 are disposed so as to be spaced apart from each other in the vertical direction of the guide panel 200, so that, when the guide panel 200 moves in the vertical direction by the external impact and collides with the chip on film 400, the buffer bars 212 can be elastically deformed to suppress the impact applied to the chip on film 400. Accordingly, even when the guide panel 200 moves by the external impact and collides with the chip on film 400, as the impact applied to the chip on film 400 by the buffer bar 212 is alleviated, a damage of the chip on film 400 can be effectively suppressed.

The buffer bar 212 can include the body 2121 and the node 2122. The body 2121 can have a larger cross-sectional area than the node 2122. The cross-sectional area of the node 2122 can be smaller than that of the body 2121, and the node 2122 can include a plurality of nodes disposed at spacings along the longitudinal direction of the buffer bar 212.

Because of such structure, when the guide panel 200 moves as the external impact is applied thereto, the buffer bar 212 comes into contact with the chip on film 400. The buffer bar 212 in contact with the chip on film 400 moves in the buffer space 211 due to elastic deformation of the node 2122, and accordingly, the impact applied to the chip on film 400 is able to be effectively suppressed.

When the guide panel 200 moves as the external impact is applied to the display apparatus, the elastic deformation can occur mainly on the node 2122. Therefore, when there is an abrupt step at a boundary between the node 2122 and the body 2121, such step can become a notch. When the buffer bar 212 is continuously and repeatedly elastically deformed, the buffer bar 212 can be damaged at the notch.

The node 2122 can be formed such that the cross-sectional area thereof decreases toward a central portion 2122a. Because of such structure, the damage to the buffer bar 212 at the abrupt step can be effectively suppressed by preventing the formation of the abrupt step at the boundary between the node 2122 and the body 2121.

Figure 8:
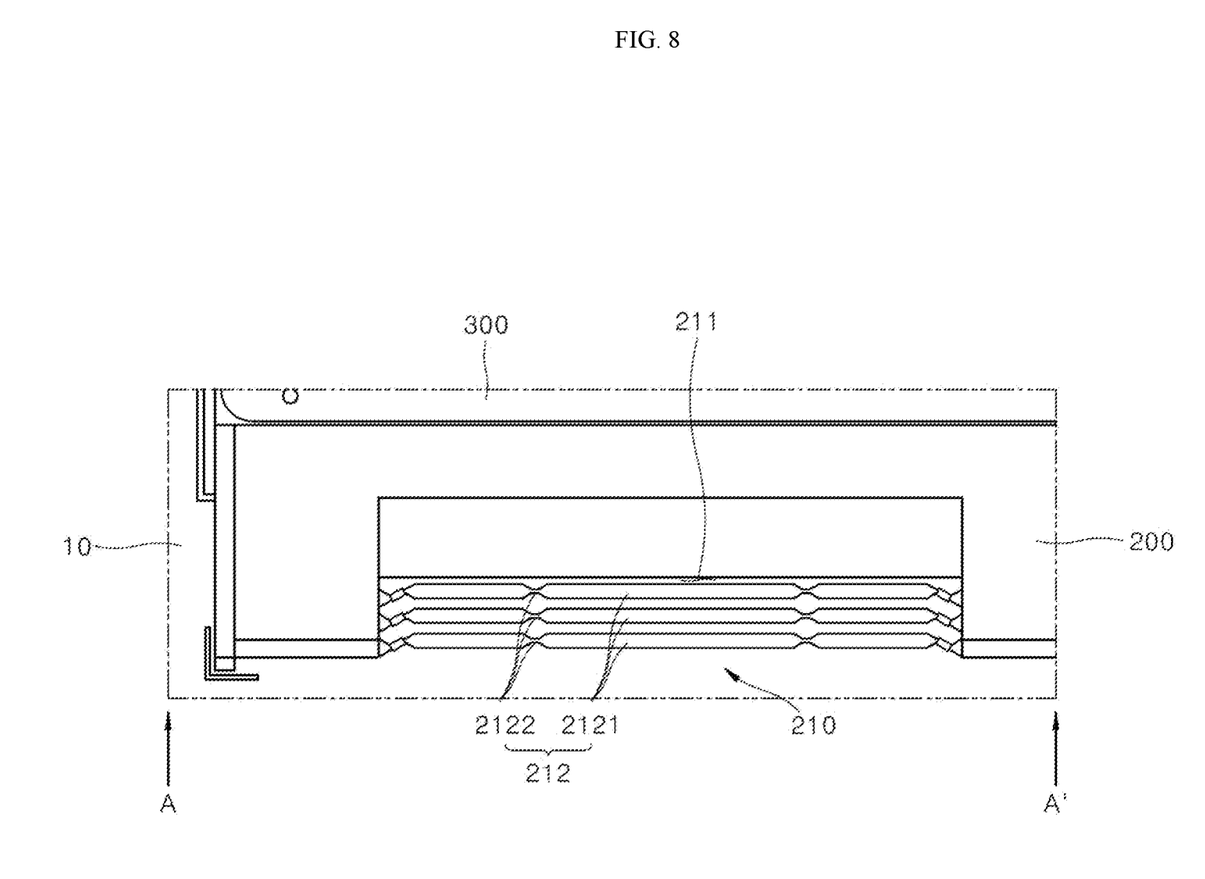
FIG. 8 is a view showing a deformed state of a buffer bar in a display apparatus according to an embodiment of the present disclosure.

FIG. 8 is a view showing a deformed state of the buffer bar 212 in the display apparatus according to an embodiment. FIG. 8 is a view taken along the line AA' in FIG. 2.

FIG. 8 shows that, as the external impact is applied on the display apparatus, the guide panel 200 moves, and thus, the buffer bar 212 and the bent portion 410 of the chip on film 400 come into contact with each other to deform the buffer bar 212. For clarity of description, the illustration of the chip on film 400 is omitted in FIG. 8.

The node 2122 can be at least partially elastically deformed by the external impact. In FIG. 8, for example, a state in which the nodes 2122 disposed at both edges of the buffer 210 among the nodes 2122 are all deformed by the external impact.

However, depending on a magnitude of the external impact applied to the display apparatus, a location where the external impact is applied, and a direction in which the external impact is applied, deformed shapes of the buffer bar 212, the number of the buffer bars 212 to be deformed, and the like can vary.

In the display apparatus according to an embodiment, the buffer bar 212 can be elastically deformed in the direction intersecting with the longitudinal direction thereof when being subjected to the impact. Further, the chip on film 400 can be disposed such that at least portion thereof moves in the direction in which the buffer bar 212 is deformed. Therefore, when the guide panel 200 moves by the external impact, at least a portion of the buffer bar 212 can be elastically deformed to move in the buffer space 211.

When the external impact is applied to the display apparatus, the guide panel 200 moves due to the impact. Accordingly, the bent portion 410 of the chip on film 400 disposed at the position extremely close to the lower end of the guide panel 200 can come into contact with the lower end of the guide panel 200. In this regard, the chip on film 400 and the buffer bar 212 disposed at the lower end of the guide panel 200 can come into contact with each other.

At least some of the plurality of the buffer bars 212 can be deformed and move in the buffer space 211 when subjected to the impact.

When the chip on film 400 comes into contact with the buffer bar 212, the buffer bar 212 is pressed by the chip on film 400, and the node 2122 is elastically deformed by such pressing force. Accordingly, the buffer bar 212 can move in the buffer space 211.

An impact force occurred on the chip on film 400 as the guide panel 200 collides with the chip on film 400 is alleviated by the deformation and the movement of the buffer bar 212. Accordingly, the damage to the chip on film 400 by the external impact can be significantly suppressed.

Figure 9:
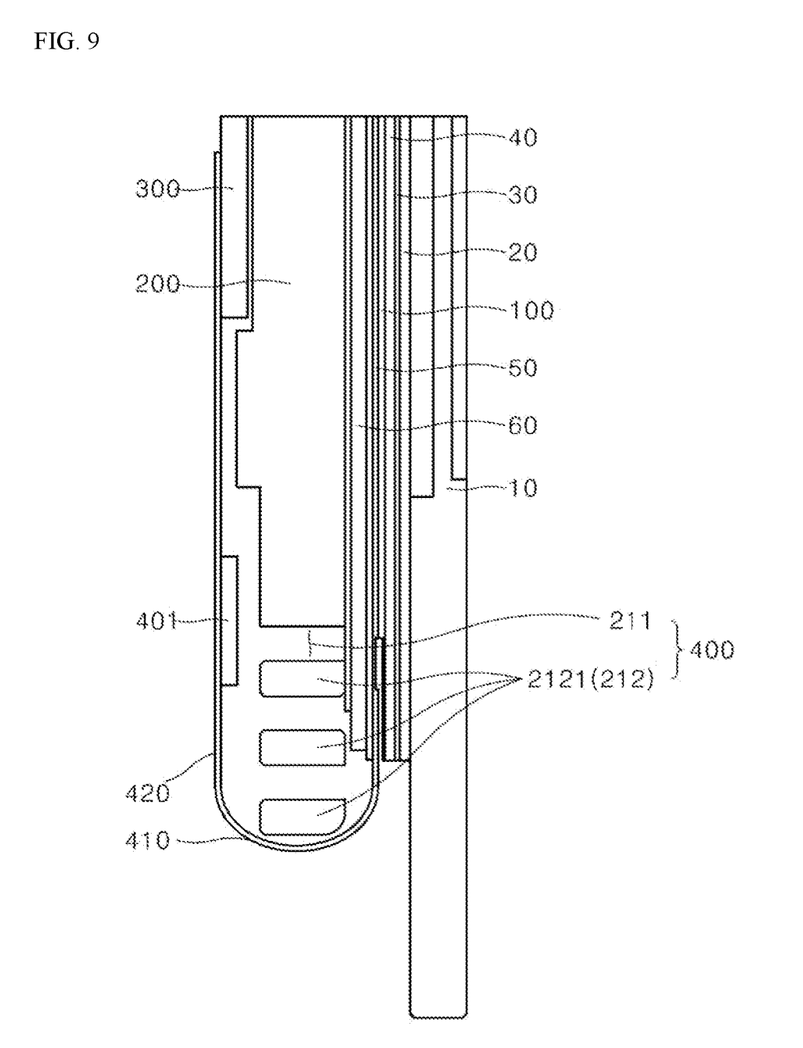
FIG. 9 is a side cross-sectional view showing a buffer bar in a display apparatus according to an embodiment of the present disclosure.

FIG. 9 is a side cross-sectional view showing the buffer bar 212 in the display apparatus according to an embodiment of the present disclosure.

Referring to FIG. 9, as described above, one side of the chip on film 400 can be coupled to the display panel 100, and the other side thereof can be coupled to the printed circuit board 300 mounted on the rear face of the guide panel 200. The chip on film 400 can be disposed such that the lower end of the bent portion 410 is extremely close to the lower end of the guide panel 200.

In this regard, in the guide panel 200, the buffer 210 can be disposed at a location corresponding to the location at which the chip on film 400 is disposed.

In one example, the chip on film 400 can include the driving chip 401 that drives the display panel 100. The driving chip 401 can include, for example, an integrated circuit for controlling at least some of operations of the display panel 100.

The driving chip 401 can protrude from the chip on film 400 more than other portions of the chip on film 400. Because of such protruding structure, in the chip on film 400, the driving chip 401 is less durable than other elements and thus is able to be relatively easily damaged by the external impact. Therefore, in order to suppress the driving chip 401 from being damaged by the external impact, the driving chip 401 needs to be disposed at a safer position against the external impact.

Accordingly, the driving chip 401 can be mounted on the linear portion 420 and disposed to be spaced apart from the end of the guide panel 200. The damage of the chip on film 400 can mainly occur in the portion where the guide panel 200 pressurizes the chip on film 400 as the lower end of the guide panel 200 and the chip on film 400 are in contact with each other. Therefore, the damage of the chip on film 400 can occur mainly in the bent portion 410.

In the display apparatus according to an embodiment, the driving chip 401 is disposed on the linear portion 420 far from the lower end of the guide panel 200 without being disposed on the bent portion 410, so that, even when the guide panel 200 and the chip on film 400 come into contact with each other due to the external impact, the contact between the guide panel 200 and the driving chip 401 is avoided, thereby effectively suppressing the damage to the driving chip 401.

The display apparatus according to an embodiment of the present disclosure can be described as follows.

An aspect of the present disclosure provides a display apparatus including a display panel for displaying or reproducing an image or a video, a guide panel disposed in the rear of the display panel, a printed circuit board mounted on the guide panel and electrically connected to the display panel, and a chip on film (COF) having one side electrically connected to the display panel and the other side (or another side) electrically connected to the printed circuit board, wherein a portion of the chip on film is bent to surround the guide panel, wherein, a buffer for alleviating an impact applied to the chip on film is formed in a portion of the guide panel surrounded by the chip on film.

In one implementation, the chip on film includes a plurality of chip on films, and the buffer includes a plurality of buffers disposed at an end of the guide panel in a number corresponding to the number of the chip on films.

In one implementation, the buffer includes a buffer space defined at an end of the guide panel, and a buffer bar including a plurality of buffer bars disposed to be spaced apart from each other in the buffer space, wherein the buffer bar is elastically deformable when subjected to the impact.

In one implementation, the buffer bar includes a body, and a node having a cross-sectional area smaller than a cross-sectional area of the body, wherein the node includes a plurality of nodes at spacings along a longitudinal direction of the buffer bar.

In one implementation, the node is formed such that the cross-sectional area thereof decreases toward a central portion.

In one implementation, at least a portion of the node is elastically deformed by the external impact.

In one implementation, the chip on film includes a bent portion disposed at the end of the guide panel and formed in a bent shape to surround the portion of the buffer bar, and a linear portion connected to the bent portion.

In one implementation, the chip on film includes a driving chip for driving the display panel, and the driving chip is mounted on the linear portion and disposed to be spaced apart from the end of the guide panel.

In one implementation, the buffer bar is elastically deformed in a direction intersecting the longitudinal direction when subjected to the impact, and at least a portion of the chip on film moves in the deformation direction of the buffer bar.

In one implementation, at least some of the plurality of the buffer bars are deformed and moved in the buffer space when subjected to the impact.

In one implementation, the display apparatus further includes a cover glass, a touch sensor disposed in the rear of the cover glass and disposed in front of the display panel, wherein the touch sensor recognizes a touch input of a user, a back plate disposed in the rear of the display panel, and a metal plate disposed in the rear of the back plate and disposed in front of the guide panel.

In one implementation, the display apparatus further includes a first adhesive layer disposed between the cover glass and the touch sensor, and a second adhesive layer disposed between the touch sensor and the display panel.

The present disclosure as described above is not limited to the above-described embodiments and the accompanying drawings. It will be apparent to those of ordinary skill in the technical field to which the present disclosure belongs that various substitutions, modifications and changes can be made within the scope not departing from the technical ideas of the present disclosure. Therefore, the scope of the present disclosure is indicated by the following claims, and all changes or modifications derived from the meaning and scope of the claims and their equivalent concepts should be construed as being included in the scope of the present disclosure.

What is claimed is:

1. A display apparatus comprising:
    a display panel configured to display or reproduce an image or a video;
    a guide panel disposed at a rear of the display panel;
    a printed circuit board mounted on the guide panel and electrically connected to the display panel; and
    a chip on film (COF) having one side electrically connected to the display panel and another side electrically connected to the printed circuit board,
    wherein a portion of the COF is bent to surround the guide panel,
    wherein a buffer for alleviating an impact applied to the COF is formed in a portion of the guide panel surrounded by the COF, and
    wherein the buffer includes:
        a buffer space defined at an end of the guide panel; and
        a buffer bar including a plurality of buffer bars disposed to be spaced apart from each other in the buffer space, wherein the buffer bar is elastically deformable when subjected to the impact.

2. The display apparatus of claim 1, wherein the COF includes a plurality of chip on films, and
    wherein the buffer includes a plurality of buffers disposed at an end of the guide panel in a number corresponding to the number of the chip on films.

3. The display apparatus of claim 1, wherein the buffer bar includes:
    a body; and
    a node having a cross-sectional area smaller than a cross-sectional area of the body, wherein the node includes a plurality of nodes at spacings along a longitudinal direction of the buffer bar.

4. The display apparatus of claim 3, wherein the node is formed so that a cross-sectional area thereof decreases toward a central portion.

5. The display apparatus of claim 3, wherein at least a portion of the node is elastically deformed by the impact.

6. The display apparatus of claim 3, wherein the COF includes:
    a bent portion disposed at the end of the guide panel and formed in a bent shape to surround the portion of the buffer bar; and
    a linear portion connected to the bent portion.

7. The display apparatus of claim 6, wherein the COF includes a driving chip configured to drive the display panel,
    wherein the driving chip is mounted on the linear portion and disposed to be spaced apart from the end of the guide panel.

8. The display apparatus of claim 3, wherein the buffer bar is elastically deformed in a direction intersecting with the longitudinal direction when subjected to the impact, and
    wherein at least a portion of the COF moves in the deformation direction of the buffer bar.

9. The display apparatus of claim 8, wherein at least some of the plurality of the buffer bars are deformed and moved in the buffer space when subjected to the impact.

10. The display apparatus of claim 1, further comprising:
    a cover glass;
    a touch sensor disposed at a rear of the cover glass and disposed in front of the display panel, wherein the touch sensor recognizes a touch input of a user;
    a back plate disposed at the rear of the display panel; and
    a metal plate disposed at a rear of the back plate and disposed in front of the guide panel.

11. The display apparatus of claim 10, further comprising:
a first adhesive layer disposed between the cover glass and the touch sensor; and
a second adhesive layer disposed between the touch sensor and the display panel.

* * * * *